United States Patent [19]
Merritt

[11] Patent Number: 6,049,489
[45] Date of Patent: Apr. 11, 2000

[54] METHODS USING A DATA READ LATCH CIRCUIT IN A SEMICONDUCTOR DEVICE

[75] Inventor: Todd A. Merritt, Boise, Id.

[73] Assignee: Micron Technology, Inc., Boise, Id.

[21] Appl. No.: 09/374,663

[22] Filed: Aug. 16, 1999

Related U.S. Application Data

[63] Continuation of application No. 09/188,977, Nov. 10, 1998, Pat. No. 5,986,944, which is a continuation of application No. 08/799,357, Feb. 14, 1997, Pat. No. 5,877,987.

[51] Int. Cl.$^7$ ................................ G11C 8/00
[52] U.S. Cl. .............. 365/189.05; 365/205; 365/233.5; 365/230.06
[58] Field of Search ................ 365/189.01, 230.01, 365/189.05, 205, 233.5, 230.06

[56] References Cited

U.S. PATENT DOCUMENTS

| | | | |
|---|---|---|---|
| 4,173,783 | 11/1979 | Couleur et al. | 364/200 |
| 4,355,377 | 10/1982 | Sud et al. | 365/203 |
| 5,325,330 | 6/1994 | Morgan | 365/189.05 |
| 5,455,795 | 10/1995 | Nakao et al. | 365/189.05 |
| 5,594,704 | 1/1997 | Konishi et al. | 365/233 |
| 5,657,292 | 8/1997 | McClure | 365/233 |
| 5,696,719 | 12/1997 | Baek et al. | 365/189.05 |
| 5,784,331 | 7/1998 | Lysinger | 365/230.06 |
| 5,867,446 | 2/1999 | Kanishi et al. | 365/233 |
| 5,877,987 | 3/1999 | Merritt | 365/189.05 |
| 5,963,504 | 10/1999 | Manning | 365/233 |
| 5,986,944 | 11/1999 | Merritt | 365/189.05 |

OTHER PUBLICATIONS

"Micron 4 MEG×4/2 MEG×8 SDRAM", *Micron Synchronous DRAM Data Book*, Micron Technology, Inc., 1–44, (Rev. Feb. 1997).

*Primary Examiner*—Viet Q. Nguyen
*Attorney, Agent, or Firm*—Schwegman, Lundberg, Woessner & Kluth, P.A.

[57] ABSTRACT

A method and circuit for self-latching data read lines that are used to transfer data that is read from a memory array of a memory device to a data output register of the memory device, wherein a self-latching latch circuit is connected to each data read line The latch circuits are located physically near the output of the memory array, for latching data that is read from the memory array as soon as the data is applied to the data read lines, and prior to the data being latched in the data output register, thereby minimizing the effects of propagation delay so that the memory cycle time can be decreased. In one embodiment wherein the memory is organized in a "×4" configuration, different groups of the data read lines are selected in alternate read cycles, and the data read lines of the non-selected data read group are equilibrated automatically during the read cycle using the conventional test circuits of the memory device.

14 Claims, 8 Drawing Sheets

METHODS USING A DATA READ LATCH CIRCUIT IN A SEMICONDUCTOR DEVICE

This is a continuation of application U.S. Ser. No. 09/188,977, filed Nov. 10, 1998, now U.S. Pat. No. 5,986,944 which is a continuation of application U.S. Ser. No. 08/799,357, filed Feb. 14, 1997, now U.S. Pat. No. 5,877,987.

FIELD OF THE INVENTION

The present invention relates to semiconductor memory devices, and in particular, to a method and circuit for latching data read lines in the data output path of a semiconductor memory device, such as a synchronous dynamic random access memory device.

BACKGROUND OF THE INVENTION

In read operations for conventional semiconductor memory devices, such as synchronous dynamic random access memory (SDRAM) devices or asynchronous dynamic random access memory (DRAM) devices, a row address is specified for use with a column address. Column address changes are detected by a circuit that provides a timing pulse that enables the data output register after a fixed predetermined delay. The length of the delay must provide for precharging, address decoding, sensing and driving for the longest read operation so that the data that is latched in the data output register represents the data that has been read from the memory array and not spurious signals.

The data output path includes sense amplifier circuits which are located at the output of the memory array for amplifying data read out of the memory array. Data amplified by the sense amplifiers is transferred through data read lines to the data output register which latches the data read from the memory array. The data output register is located physically adjacent to data input/output pins of the chip on which the memory array is fabricated. The physical separation between the sense amplifiers and the data output data register introduces a propagation delay between the time that valid data is available at the output of the memory array and the time that the data is latched in the data output register. The read out of new data must be delayed until the data read out of the memory array has been latched in the data output register. Sufficient time must be provided to allow the data signals to propagate down to the end of the chip before the data output register is clocked to latch the data signals into the data output register.

The delay provided may be too short for some memory cells and sense amplifiers that respond relatively slowly due to their physical location on the chip. In such a case, the data output register could be enabled at a time which spurious signals exist on the data output path. If the delay is long enough to avoid all spurious signals, data from faster cells accessed will wait at the data output register before the data output register is clocked. A faster access time would have been possible had the delay been shorter.

A further consideration is that in known memory systems, the data read lines are precharged between every data read cycle. Time must be provided to complete the precharging before applying the data read from the memory array to the data read lines for transfer to the data output register. This further limits the ability to provide faster cycle times for the memory system.

For the reasons stated above, and for other reasons which will become apparent to those skilled in the art upon reading and understanding the present specification, there is a need in the art to minimize the time required for transferring data read out of a semiconductor memory system to the data output register of the memory system to allow faster cycle times for the memory system.

SUMMARY OF THE INVENTION

The present invention provides a method and circuit for self-latching data read lines in the data output path of a semiconductor memory device, such as a synchronous dynamic random access memory device. In accordance with the invention, a data read line latch circuit is connected to each of the data read lines for latching data that is read out of the memory array of the device prior to the data being latched in the data output register of the memory device. The data read line latch circuits are located physically adjacent to the memory array.

In one embodiment, the self-latching circuit comprises an inverter latch circuit that includes first and second series connected inverter circuits with the input of the first inverter circuit being connected to the data read line and the output of the second inverter circuit being connected to the data read line. The use of the dual inverter latch introduces substantially no delay in the data read line path. In addition, because the inverter latch circuit latches the data as soon as the data is applied to the data read lines, valid data is provided for substantially the entire duration of the read cycle. Consequently, the self-latching data read lines provide a wider time window for latching data into the data output register of the memory device. Moreover, because the data is latched into the data read line latch circuits as soon as the data is applied to the data read lines, it is not necessary to equilibrate the data read lines between memory access cycles. In one embodiment, wherein the memory is organized in a "×4" configuration, different groups of the data read lines are selected in alternate read cycles, and the data read lines of the non-selected data read group are equilibrated automatically during the read cycle using the conventional test circuits of the memory device.

Further in accordance with the invention, there is provided a data output path for a semiconductor memory device that includes a memory array for storing data. The data output path includes a plurality of data amplifier circuits that are located at the output of the memory array for amplifying data read from the memory array, a data output register for latching data read from the memory array, and a plurality of data read lines coupled between the data amplifier circuits and the data output register. The data read lines transfer data amplified by the data amplifier circuits to the data output register. The data output path additionally includes a plurality of data read line latch circuits with each of the data read line latch circuits being connected to a different one of the data read lines. The data read line latch circuits are associated with the data amplifier circuits and, as such, are located physically adjacent to or in the proximity of the memory array. The data read line latch circuits are interposed between the data amplifier circuits and the data output register for latching data prior to the data being latched by the data output register.

In accordance with a further aspect of the invention, there is provided a method for transmitting data read from a memory array of a semiconductor memory device to a data output register of the memory device, wherein data read from the memory array is amplified by a data amplifier that is coupled to the data output register through a data read line. The method includes connecting a data read line latch circuit to the data read line at the output of the data amplifier circuit;

latching the data amplified by the data amplifier circuit into the data read line latch circuit; and subsequently latching the data latched in the data read line latch circuit into the data output register.

DESCRIPTION OF THE PREFERRED EMBODIMENT

In the following detailed description of the preferred embodiment, reference is made to the accompanying drawings which form a part hereof, and in which is shown by way of illustration a specific preferred embodiment in which the invention may be practiced. The preferred embodiment is described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the appended claims.

Figure 1:
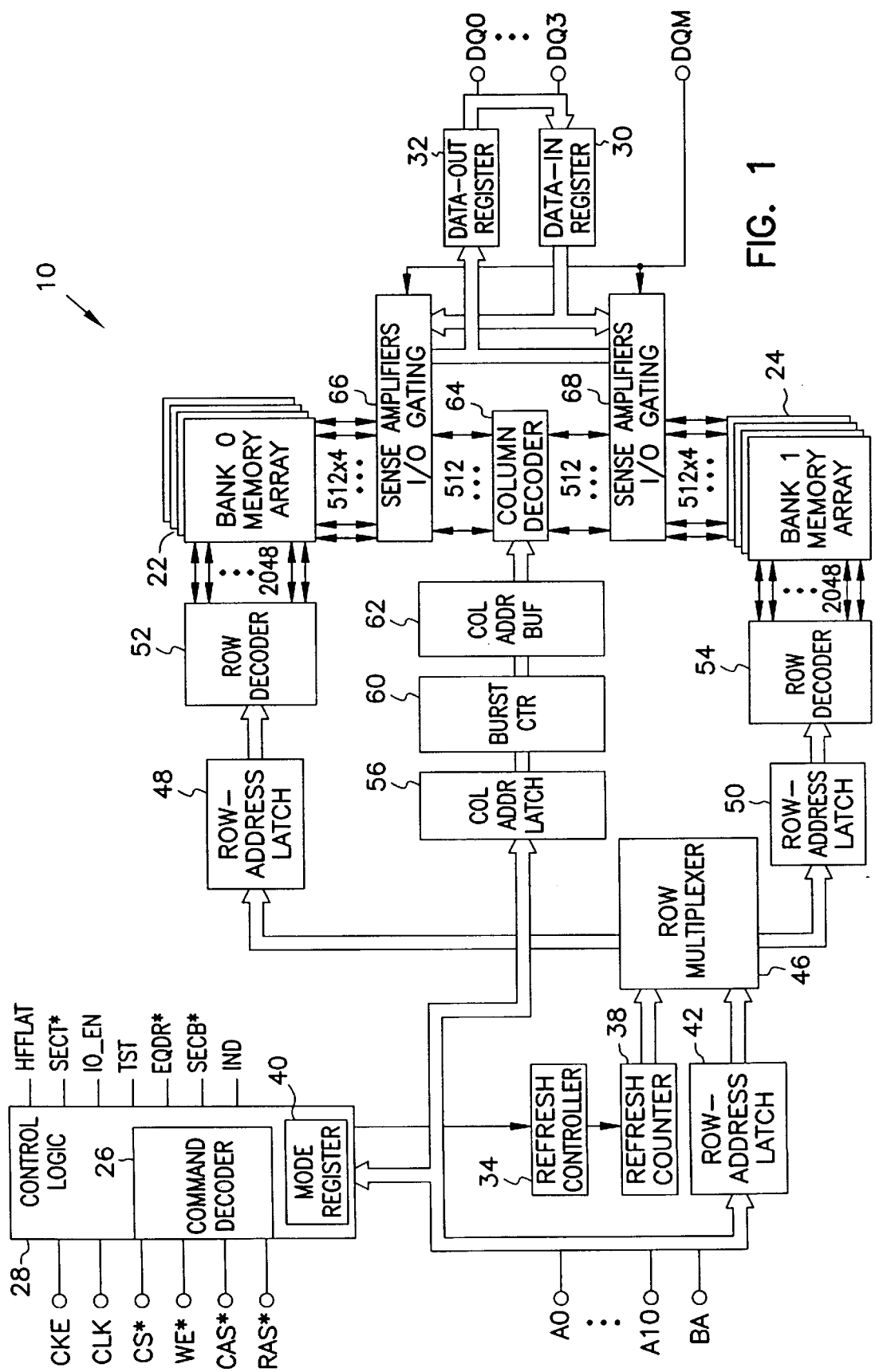
FIG. 1 is a functional block diagram of a synchronous dynamic random access memory incorporating self-latching data read lines in accordance with the invention.

FIG. 1 is a functional block diagram of a synchronous dynamic random access memory (SDRAM) 10 incorporating the self-latching data read line arrangement provided by the invention. Although the self-latching data read line arrangement of the invention is particularly applicable to SDRAM devices, the invention can be used in asynchronous dynamic random access memory (DRAM) devices or other types of memory systems in which data is read out of a memory and latched in a data output register. In the exemplary embodiment, the SDRAM 10 is organized as a dual 8 Meg×4 memory. Much of the circuitry of the SDRAM 10 is similar to circuitry in known SDRAM devices, such as the dual bank synchronous memory commercially available from Micron Technology, Inc. Boise Id., 83707 as the type MT48LC2M8A1 S 2 Meg×8 SDRAM, and which is described in detail in the corresponding Micron Technology, Inc. the Functional Specification of which is incorporated herein by reference.

The SDRAM 10 includes a bank 0 memory array 22 and a bank 1 memory array 24 which both comprise storage cells organized in rows and columns for storing data. In one embodiment of SDRAM 10, each bank memory array comprises four separate arrays organized as 2048 rows by 512 columns by four bits.

A system clock (CLK) signal is provided through a CLK input pin and a clock enable signal (CKE) is provided through a CKE input pin to SDRAM 10. The CLK signal is activated and deactivated based on the state of the CKE signal. All the input and output signals of SDRAM 10, with the exception of the CKE input signal during power down and self refresh modes, are synchronized to the active going edge (the positive going edge in the embodiment illustrated in FIG. 1) of the CLK signal.

A chip select (CS*) input pin inputs a CS* signal which enables, when low, and disables, when high, a command decoder 26. Command decoder 26 is included in control logic 28. Command decoder 26 receives control signals including a row address strobe (RAS*) signal on a RAS* pin, column address strobe (CAS*) signal on a CAS* pin, and a write enable (WE*) signal on a WE* pin. Command decoder 26 decodes the RAS*, CAS*, and WE* signals to place control logic 28 in a particular command operation sequence. Control logic 28 controls the various circuitry of SDRAM 10 based on decoded commands, such as during controlled reads to or writes from bank 0 memory array 22 and bank 1 memory array 24. A bank address (BA) signal is provided on a BA input pin to define which bank memory array should be operated on by certain commands issued by control logic 28.

Address input bits are provided on input pins A0–A10. As described below, both the row and column address input bits are provided on the address input pins. During write transfer operations, data is supplied to SDRAM 10 via input/output pins DQ0–DQ3. During read transfer operations, data is clocked out of SDRAM 10 via input/output pins DQ0–DQ3. An input/output mask signal is provided on a DQM input pin to provide control for a data input register 30 and a data output register 32.

Power-up and initialization functions of the SDRAM 10 are conducted in the conventional manner. Moreover, refresh functions of the SDRAM 10 are provided in the known manner employing a refresh controller 34 and a refresh counter 38 to refresh the memory arrays.

A valid ACTIVE command is initiated by control logic 28 with the CS* and RAS* signals low and with the CAS* and WE* signals high on a rising edge of the CLK signal. During the ACTIVE command the state of a memory bank address signal BA signal determines which bank memory array to activate and address. During the ACTIVE command, a value representing a row address of the selected bank memory array, as indicated by address bits on input pins A0–A10, is latched in a row address latch 42. The latched row address is provided to a row multiplexer 46 which provides a row address to row address latch 48 to be provided to bank 0 memory array 22 or row address latch 50 to be provided to bank 1 memory array 24, depending on the state of the BA signal. A row decoder 52 decodes the row address provided from row address latch 48 to activate one of the 2,048 lines corresponding to the row address for read or write transfer operations, to thereby activate the corresponding row of storage cells in bank 0 memory array 22. Row decoder 54 similarly decodes the row address in row address latch 50 to activate one of the 2,048 lines to bank 1 memory array 24 corresponding to the row address for read or write transfer operations, to thereby activate the corresponding row of storage cells in bank 1 memory array 24.

A valid READ command is initiated with the CS* and CAS* signals low, and the RAS* and WE* signals high on a rising edge of the CLK signal. The READ command from control logic 28 controls a column address latch 56 which receives address bits A0–A9 and holds a value representing a column address of the bank memory array selected by the memory bank address signal BA at the time the READ command is initiated. Address pin A10 provides an input path for a command signal which determines whether or not an AUTO-PRECHARGE command is to be initiated automatically after the READ command as is known in the art. The READ command provided from control logic 28 also initiates a burst read cycle by starting a burst counter 60 in the manner known in the art.

A column address buffer 62 receives the output of the burst counter 60 to provide the current count of the column address to a column decoder 64. Column decoder 64 activates four of the 512×4 lines, provided to sense amplifiers and input/output (I/O) gating circuit 66 and sense amplifiers and I/O gating circuit 68 corresponding to the current column address, indicated by column address bits which is indicated by the latter nine address bits of the address signal and which are latched by signal CAS*. The column address bits are designated in the following description as CA0–CA9. Sense amplifiers and I/O gating circuits 66 and 68 operate in a manner known in the art to sense the data stored in the storage cells addressed by the active row decoder line and the active column decoder lines to provide the selected four bit byte of data from either bank 0 memory array 22 or bank 1 memory array 24, respectively, to data output register 32 during a read operation. Data output register 32 provides the selected four bit byte of data to input/outputs at lines DQ0–DQ3.

The control logic 28 provides a helper flip flop latch signal HFFLAT, a select top signal SECT*, a select bottom signal SECB*, an input/output enable signal IO_EN, and an equilibrate enable signal EQDR* for purposes to be described below. The control logic also provides latch signals IND for the data output register 32 and a test signal TST.

A valid WRITE command is initiated with the CS*, CAS*, and WE* signals low and the RAS* signal high on the rising edge of the CLK signal. The WRITE command provided from command controller 28 clocks column address latch 56 to receive and hold a value representing a column address of the bank memory array selected by the state of the memory bank address signal BA at the time the WRITE command is initiated, as indicated by the address provided on address inputs A0–A9. As with the read operation, during the WRITE command, address pin A10 provides the additional feature to select whether or not the AUTO-PRECHARGE command is to be initiated following the WRITE command. Burst counter 60 initiates the burst write cycle. Column address buffer 62 receives the output of the burst counter 60 and provides the current column address to column decoder 64. Column decoder 64 activates four of the 512×4 lines to sense amplifiers and I/O gating circuits 66 and 68 corresponding to the column address to indicate where the incoming four bit byte of data is to be stored in either bank 0 memory array 22 or bank 1 memory array 24.

During WRITE command operations, data is provided on input/output pins DQ0–DQ3 to data input register 30. The four bit byte of input write data is provided to the selected bank memory array with sense amplifiers and I/O gating circuits 66 or 68 in a manner known in the art based on the activated four lines corresponding to the current column address.

Figure 2:
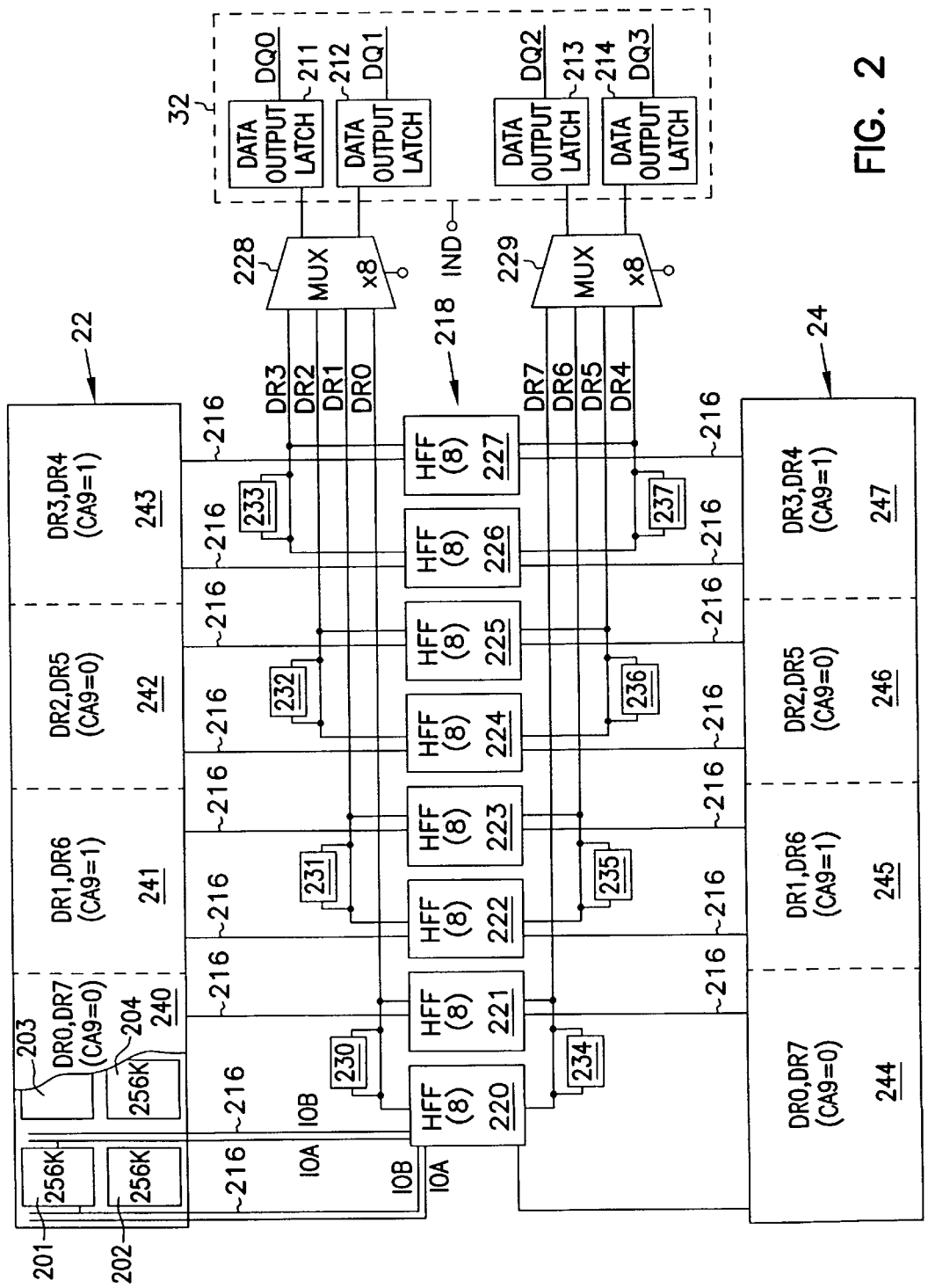
FIG. 2 is a block diagram of the memory banks and the data output path of the synchronous dynamic random access memory of FIG. 1, and illustrating the data read line latch circuits provided by the invention.

FIG. 2 illustrates the portion of the sense amplifiers and input/output gating circuits 66 and 68 that provide the data output path that extends between the output of the memory banks 22 and 24 and the data output register. Each memory bank, such as bank 0 memory array 22 includes a plurality of 256K bit arrays, such as arrays 201–204 for bank 0 memory array 22. The data output path includes eight data read lines DR0–DR7. In the exemplary embodiment, the SDRAM device is organized for "×4" operation and the data output register 32 includes four data output latch circuits 211–214. The data read out of the memory arrays 22 and 24 is transferred to the data output register 32 through multiplexer circuits 228 and 229.

Data read from one of the memory banks, and latched by associated sense amplifiers (not shown), propagates through input/output transistors (not shown) onto input/output signal lines 216 and into data read amplifier or sense amplifier circuits 218 of the sense amplifier and output gating circuits 66 and 68. Each of the input/output signal lines 216 includes two input/output lines IOA and IOB and, although not shown in FIG. 2, each input/output line, such as input/output line IOA, includes paired lines as is conventional. Only two sets IOA and IOB of the input/output line pairs are shown in FIG. 2 to simplify the drawings.

Prior to coupling to the data output register 32, the signals on the input/output lines 216 are amplified by amplifier circuits such as DC sense amplifier circuits or helper flip flops. In the exemplary embodiment, the data read amplifier circuits 218 comprise a plurality of helper flip flop circuits 220–227 which amplify the data signals provided on the input/output lines IOA and IOB and couple the data signals to the data read lines DR0–DR7. Only data read lines DR0–DR7 are shown in FIG. 2 to simplify the drawing. However, the data read lines are paired lines and include complementary data read lines DR0*–DR7* in addition to the data read lines DR0–DR7.

In the exemplary embodiment, each of the helper flip flop circuits 220–227 includes eight helper flip flops for each of the data read lines. The data signals proceed from the helper flip flop circuits 220–227 to the data output latch circuits 211–214 of the data output register 32 through data read multiplexers 228 and 229 which are configured to provide "×4" operation in the exemplary embodiment. However, the SDRAM device can be configured to provide any data width output. By way of example, the SDRAM device 10 is adapted to be organized in other configurations, such as a "×8" configuration, with the addition of four data output latches and with application of a signal "×8" to the multiplexer circuits to provide the outputs on all eight data read lines DR0–DR7 to the eight output data latches provided for the "×8" operation.

For the purpose of reading data from the memory banks 22 and 24, many columns are arranged to couple to a single pair of input/output lines 216, and several pairs of input/output lines 216 can be activated simultaneously responsive to a portion of the column address. The remaining portion of the column address, column address bit CA9 in the exemplary embodiment, is used to select a single pair of input/output lines, for applying the data read out of the memory arrays to the data read lines DR0–DR7 which are coupled to the data output register 32. In the "×4" operation, only four data read line pairs are coupled to the data output register 32 during a given read operation. Stated in another way, for the "×4" operation, each of the four latch circuits 211–214 of the data output register has four pairs of data read lines available during a read operation as will be described.

Memory bank address signal BA is used to select the memory bank from which data is read. The top memory bank 22 is selected when signal BA is at logic high level and the bottom memory bank 24 is selected when signal BA is at logic low level. Column address bit CA9 is used to select arrays of the memory banks from which data is read. In one embodiment, when the top bank 22 is selected, data is read from portions or sub-arrays 240 and 242 of the array when column address bit CA9 is at a logic low level, and from portions 241 and 243 when column address bit CA9 is at a logic high level. When the bottom bank 24 is selected, data is read from portions 244 and 246 of the bottom bank 24 when column address bit CA9 is at a logic low level and from portions 245 and 247 of the bottom bank 24 when column address bit CA9 is at a logic high level.

In one embodiment, the arrays of the top memory bank 22 are arranged so that data bits from portion 240 are applied to input/output lines IOA and gated to data read lines DR0 and DR7 when column address bit CA9 is at a logic low level. Further, data bits from further portion 241 are applied to input/output lines IOA and gated to respective data read lines DR1 and DR6 when column address bit CA9 is at a logic high level. Data bits from portion 242 are applied to input/output lines IOA and gated to data read lines DR2 and DR5 when column address bit CA9 is at a logic low level, and data bits from portions 243 are applied to input/output lines IOA and gated to respective data read lines DR3 and DR4 when column address bit CA9 is at a logic high level.

Similarly, when the bottom array 24 is selected and column address bit CA9 is at a logic low level, data is gated from portion 244 to data read lines D0 and D7, and from portion 246 to data read lines DR2 and DR5. Also, when the bottom array 24 is selected and column address bit CA9 is at a logic high level, data is gated from portion 245 to data read lines D1 and D6, and from portion 247 to data read lines D3 and D4.

Eight data bits are available for coupling to each of the data read lines DR0–DR7 from the top bank and eight data bits are available for coupling to each of the data read lines DR0–DR7 from the bottom bank. Thus, sixteen data bits can be coupled selectively to each of the data read lines DR0–DR7 as selected by the column addresses and bank selection signals. The steering of the data bits to the appropriate data read lines DR0–DR7 is controlled by the helper flip flop circuits 220–227. For "×4" operation, the helper flip flop circuits 220–227 are controlled to gate four data bits from the selected one of the top (bank 0) memory array 22 or the bottom (bank 1) memory array 24 to four of the data read lines. The address bit CA9 selects which of the two memory array portions 240, 242 or 241, 243 of the top bank (or bottom bank memory array portions 244–247) that are enabled. The data read lines DR0–DR7 are located between the two memory banks and extend the length of the memory banks as is shown in FIG. 2.

In accordance with the invention, the data output path includes a plurality of data read latch circuits, such as data latch circuits 230–237 shown in FIG. 2. The data read latch circuits are located physically near the memory array at the output of the helper flip flops. The data output register 32 is located at the end of the chip to be physically near the data output bond pads of the chip and thus is physically separated from the helper flip flops and the memory arrays.

A data read latch circuit is connected to each data read line at the output of the helper flip flop circuits for latching the data signals as soon as the data signals are provided. As will be shown, a separate data latch circuit is provided for each data read line DR0–DR7 and for each of the complement data read lines DR0*DR7*. Because the data read out of the memory array is latched by the data read latch circuits 230–237 as soon as it is provided at the output of the helper flip flops, there is no need to equilibrate the data read lines between read cycles. Also, the effects of propagation delay are substantially eliminated because the data is latched at the output of the helper flip flop circuits and is thus valid for almost the entire read cycle time. This allows the read cycle time to be decreased, so that the memory device can be operated at a faster cycle time. It is pointed out when the SDRAM device 10 is configured for pipelined operation, the data read latch circuits serve as the first latch of the pipeline.

Figure 3:
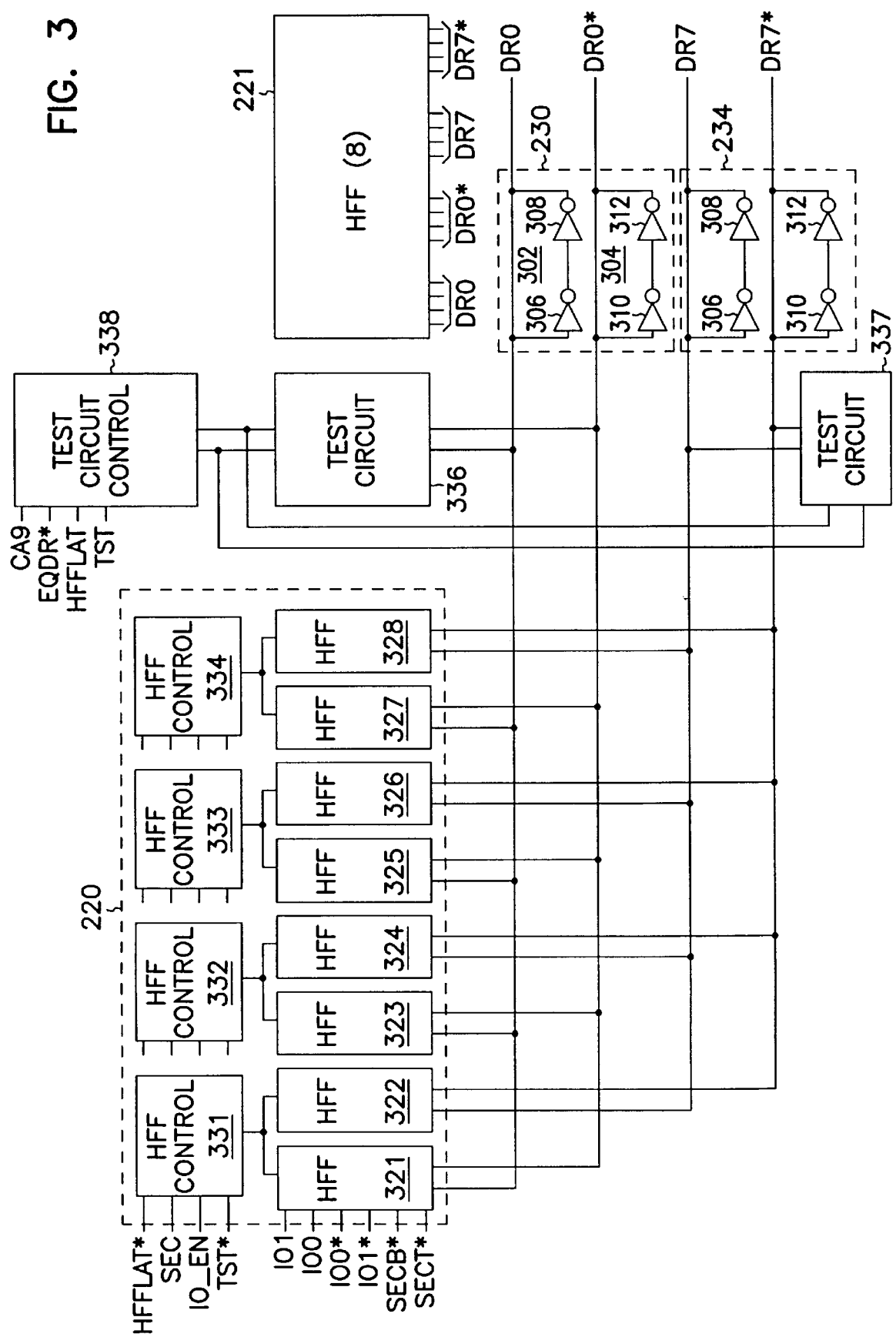
FIG. 3 is a block diagram of a portion of the data output path and illustrating the helper flip flop circuits associated with two data read line pairs of the data output path of the synchronous random access memory of FIG. 1.

Referring to FIG. 3, there is illustrated a portion of the data output path for the data read line pairs DR0, DR0* and DR7, DR7*. Only one data latch circuit 230 and only helper flip flop circuit 220 is described in detail because the helper flip flop circuits 220–227 (FIG. 2) are the similar in structure and function, and the data latch circuits 230–237 (FIG. 2) are the similar in structure and function.

Each data read latch circuit includes a pair of latch circuits. For example, data read latch circuit 230 includes a pair of latch circuits 302 and 304, one associated with data read line DR0 and the other associated with the complementary data read line DR0* of the read line pair. The latch circuit 302, which is associated with data read line DR0, includes two inverters 306 and 308. Inverter 306 has an input connected to the data read line DR0 and an output connected to the input of the inverter 308. The output of the inverter 308 is connected to the data read line DR0. Similarly, latch circuit 304 includes a pair of inverters 310 and 312. Inverter 310 has an input connected to the complementary data read line DR0* and an output connected to the input of the inverter 312. The output of the inverter 312 is connected to the data read line DR0*.

Each helper flip flop circuit, such as the helper flip flop circuit 220, includes eight helper flip flops 321–328, four helper flip flop control circuits 331–334, and a test circuit 336. In the exemplary embodiment, helper flip flop control circuit 331 controls helper flip flops 321 and 322. Helper flip flop control circuits 332, 333 and 334 control respective helper flip flop pairs 323 and 324, 325 and 326, and 327 and 328. In addition, a test circuit control 338 controls the test circuit 336 and a further test circuit (not shown). Four such test circuit controls are provided, each associated with a different two of the data read lines.

The helper flip flops 321, 323, 325 and 327 steer data read from the top bank 22 to data read line pair DR0, DR0*. Helper flip flops 322, 324, 326 and 328 steer data read from the top bank to data read line pair DR7, DR7*. Similarly, the helper flip flop circuit 221 includes a further set of eight helper flip flops (not shown) which steer data read from the bottom bank 24 to the data read line pairs DR0, DR0* and DR7, DR7*.

Referring additionally to FIG. 2, the helper flip flop circuits 222 and 223 steer data from the top and bottom banks, respectively to data read line pairs DR1, DR1* (not shown) and DR6, DR6* (not shown). The helper flip flop circuits 224 and 225 steer data from the top and bottom banks, respectively to data read line pairs DR2, DR2* (not shown) and DR5, DR5* (not shown). The helper flip flop circuits 226 and 227 steer data from the top and bottom banks, respectively to data read line pairs DR3, DR3* (not shown) and DR4, DR4* (not shown).

Figure 4:
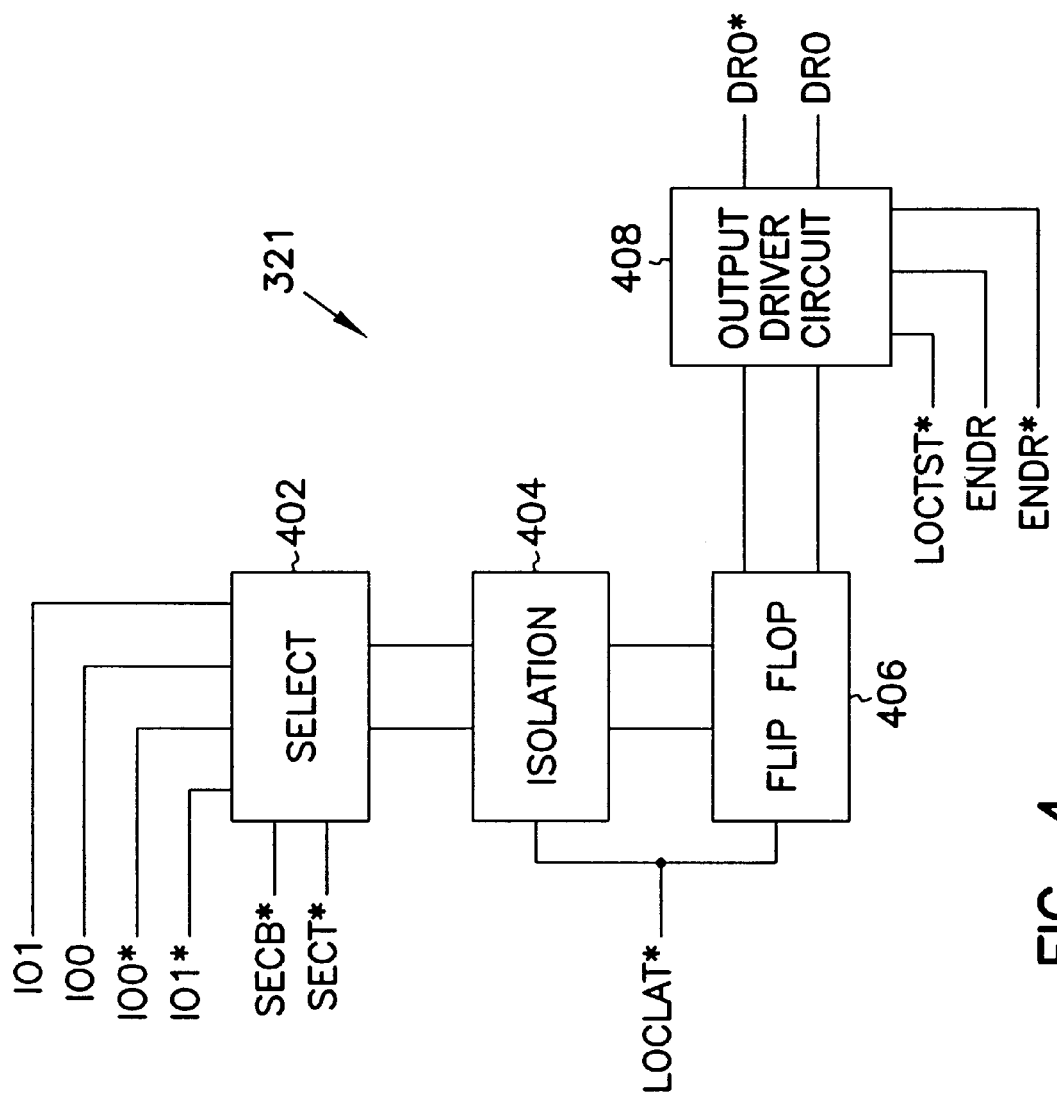
FIG. 4 is a block diagram of one of the helper flip flop circuits.

Each of the helper flip flop control circuits 331–334 responds to control and timing signals produced by the control logic 28 (FIG. 1) to enable the helper flip flops. Input signals applied to each of the helper flip flop control circuits include a clock signal HFFLAT*, a select signal SEC, an enable signal IO_EN and a test enable signal TST*. Signal HFFLAT* is obtained by inverting signal HFFLAT produced by the control logic. The signal SEC is produced by logically combining signals SECT* and SECB* using a NAND gate (not shown). Each helper flip flop control circuit, such as helper flip flop control circuit 331, provides a plurality of signals for controlling the operation of the associated helper flip flops 321 and 322, the signals including a local latch signal LOCLAT*, a local test signal LOCTST* and drive enable signals ENDR and ENDR* as are shown in FIG. 4 for helper flip flop 321.

Each of the helper flip flops 321–328 receives data inputs IO1, IO0, IO0*, IO1*, the bottom bank select signal SECB* and the top bank select signal SECT*. Each of the helper flip flops 321, 323, 325 and 327 has a first output connected to data read line DR0 and a second output connected to the complementary data read line DR0*. Each of the helper flip flops 322, 324, 326 and 328 has a first output connected to data read line DR7 and a second output connected to data read line DR7*. Similar connections are provided for the eight helper flip flops of helper flip flop circuit 221.

As has been stated, there are four test circuit controls, each individually associated with two of the data read line pairs for controlling the test circuits associated with those data read line pairs. Thus, for example, test circuit control 338, controls two test circuits, such as test circuit 336 associated with data read line pair DR0, DR0* and a further test circuit (not shown) associated with a further data read line pair which can be data read line pair DR7, DR7* or some other data read line pair. The test circuit control 338 receives column address bit CA9 and timing and control signals EQDR*, HFFLAT and TST which are produced by the control logic 28 (FIG. 1). Digressing two of the test circuit controls are adapted to respond to an active low state CA9* for the column address bit, and the other two test circuits are adapted to respond to an active high state CA9 for the column address bit. This enables four of the data read line pairs to be equilibrated in response to the selection of the other four data read line pairs as will be shown.

For "×4" operation, only four of the eight data read line pairs DR0, DR0* . . . DR7, DR7* need to be active during a given read cycle. In accordance with a feature of the invention, the four non-selected data read line pairs are equilibrated in response to the firing of the four selected data read line pairs and during the time that the data read from the memory array is latched by the appropriate ones of the data read latch circuits 230–237.

Only four of the eight data read lines DR0–DR7 (and DR0*DR7*) are active or selected during a given read operation. The test circuit 336 equilibrates the data read line pairs DR0 and DR0* when these data read lines are not selected during a read operation. A further test circuit 337 is provided for equilibrating the data read line pair DR7 and DR7* when these data read lines are not selected. The further test circuit is controlled by a test circuit control (not shown) that is similar to test circuit control 338. The test circuit 336 is also used for applying data to the data read line pairs during compression testing of the memory in the manner known in the art.

Referring to FIG. 4, each helper flip flop, such as helper flip flop 321, includes a select circuit 402, an isolation circuit 404, a flip flop 406 and an output driver circuit 408. The select circuit 402 gates data appearing on data input/output lines IO0 and IO0* from the top array 22 or data appearing on data input/output lines IO1 and IO1* from the bottom array 24 into the flip flop 406. The signal LOCLAT*, which is produced by the control circuit 331, latches into the flip flop 406 data available on paired input/output lines IO0, IO0* and IO1, IO1*. The isolation circuit 404 is responsive to the signal LOCLAT* to isolate the flip flop 406 from the load on the data input/output lines IO0, IO0* and IO1, IO1* as the data is being latched into the flip flop. The load on the data input/output lines is typically highly capacitive, and isolating the flip flop from the load on the input/output lines allows for faster switching of the flip flop. The output driver circuit 408 is a tristatable circuit that is responsive to the enable signals ENDR, ENDR* (or test signal LOCTST* when operated in the test mode) that are produced by the helper flip flop control circuit 331 (FIG. 3) and the data latched in the flip flop 406 to drive the data read lines DR0 and DR0* in accordance with the state of the latched data.

Figure 5:
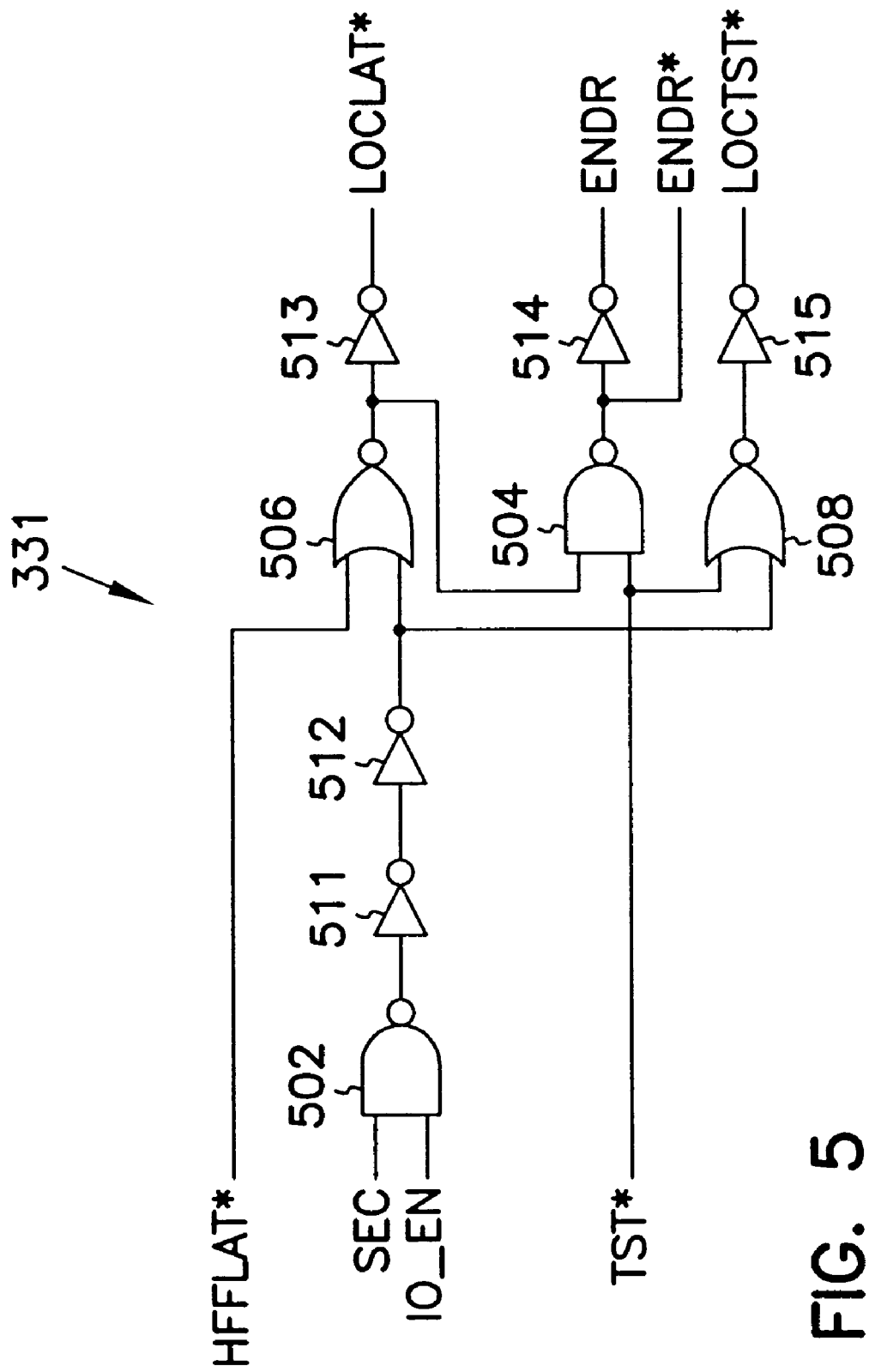
FIG. 5 is a schematic diagram of a helper flip flop control circuit for the helper flip flop circuit of FIG. 4.

With reference to FIG. 5, in one embodiment, the helper flip flop control circuit 331 includes a NAND gates 502 and 504, NOR gates 506 and 508 and inverters 511–515. NAND gate 502 has an input connected to receive signal SEC and an input connected to receive signal IO_EN. The signal SEC is a select signal that is used to select one of the data input/output line pairs IO0, IO0* or IO1, IO1* for providing data to the helper flip flop. The signal IO_EN is an input/output enable signal that enables the control circuit 331.

The output of NAND gate 502 is connected through series connected inverters 511 and 512 to one input of NOR gate 506, a second input of which is connected to receive signal HFFLAT*. The signal HFFLAT* is a clock signal that is used for clocking data into all of the helper flip flops. The signal output of NOR gate 506 is inverted by inverter 513, producing the signal LOCLAT* for clocking the helper flip flop.

The output of NOR gate 506 is also connected to an input of NAND gate 504, a second input of which is connected to receive a signal TST*. NAND gate 504 produces a signal ENDR* which signal is inverted by inverter 514 to produce a signal ENDR. The signal TST* is also applied to an input of NOR gate 508, a second input of which is connected to the output of inverter 512, and which produces a signal LOCTST*. The signal TST* is the complement of a signal TST that is used to configure the helper flip flop test circuit 336 for compression mode testing of the SDRAM device in the conventional manner.

Figure 6:
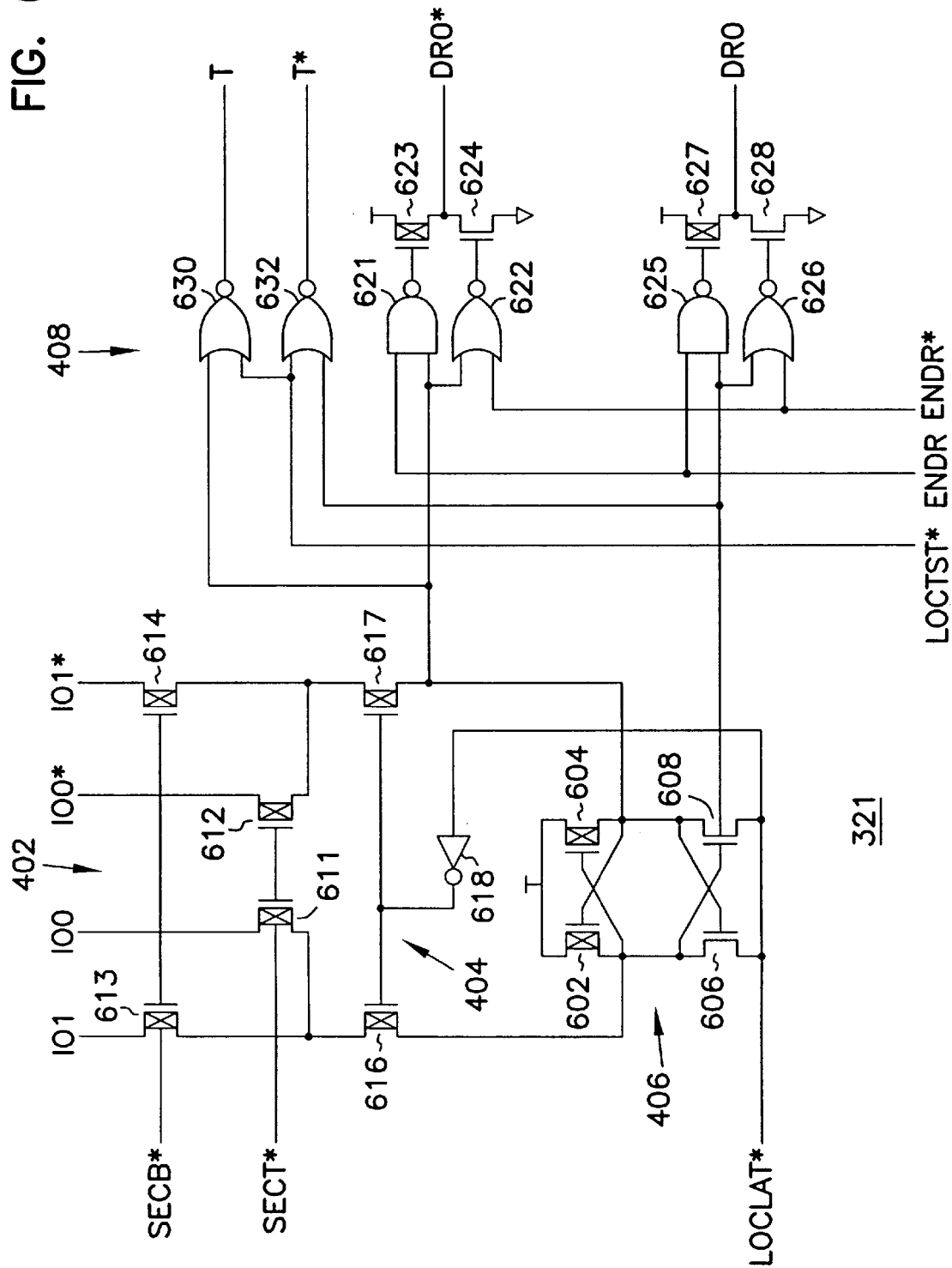
FIG. 6 is a schematic diagram of the helper flip flop circuit of FIG. 4.

Referring to FIG. 6, in one embodiment, the flip flop 406 of the helper flip flop circuit 321 is formed by cross-connected p-type transistors 602 and 604 and cross-connected n-type transistors 606 and 608. The flip flop is clocked when local latch signal LOCLAT* is in its active low state.

The select circuit 402 includes access transistors 611–614. The transistors 611 and 612 are enabled by select signal SECT* for coupling to the flip flop 406, data signals read from the top bank of the memory array 24 and appearing on input/output line pairs IO0, IO0*. The transistors 613 and 614 are enabled by select signal SECB* for coupling to the flip flop 406 data read from the bottom bank of the memory array 24 and appearing on input/output line pairs IO1, IO1*. The selected data signals are latched by the flip flop 406 in response to the local latch signal LOCLAT* that is produced by the helper flip flop control circuit 331.

The isolation circuit 404 includes isolation transistors 616 and 617 are enabled by a signal produced by an inverter 618 by inverting the latch signal LOCLAT*. The isolation circuit 404 isolates the flip flop 406 from the data input/output lines IO0, IO0* and IO1, IO1*.

The output driver circuit 408 includes a NOR/NAND logic gate pair formed by NAND gate 621 and NOR gate 622, having associated driver stage formed by series-connected, p-type and n-type transistors 623 and 624. The output driver circuit includes a further a NOR/NAND) logic gate pair formed by NAND gate 625 and NOR 626 having associated driver stage formed by series-connected, p-type and n-type transistors 627 and 628. The output driver stage provides a tri-stateable drive for the data read lines DR0 and DR0*. When the signal ENDR is at a logic low level and signal ENDR* is at a logic high level, the NOR/NAND logic gates are disabled so that all four of the transistors 623, 624 and 627, 628 are non-conducting and the output driver circuit presents a high impedance output to the data read line pair DR0 and DR0*. When the signal ENDR is at a logic high level and signal ENDR* is at a logic low level, one of the NAND gates 621 or 625 and one of the NOR gates 622 or 626 is enabled as a function of the data latched by the flip flop to drive the data read line pair DR0 and DR0* to the appropriate logic state in accordance with the data latched by the flip flop 406.

The output driver circuit 408 further includes a pair of NOR gates 630 and 632 used for test mode operation. The NOR gates 630 and 632 respond to the local test signal LOCTST* and the data signal stored in the flip flop 406 to produce complementary state test signals T and T* when the signal LOCTST* is in its active low state.

Figure 7:
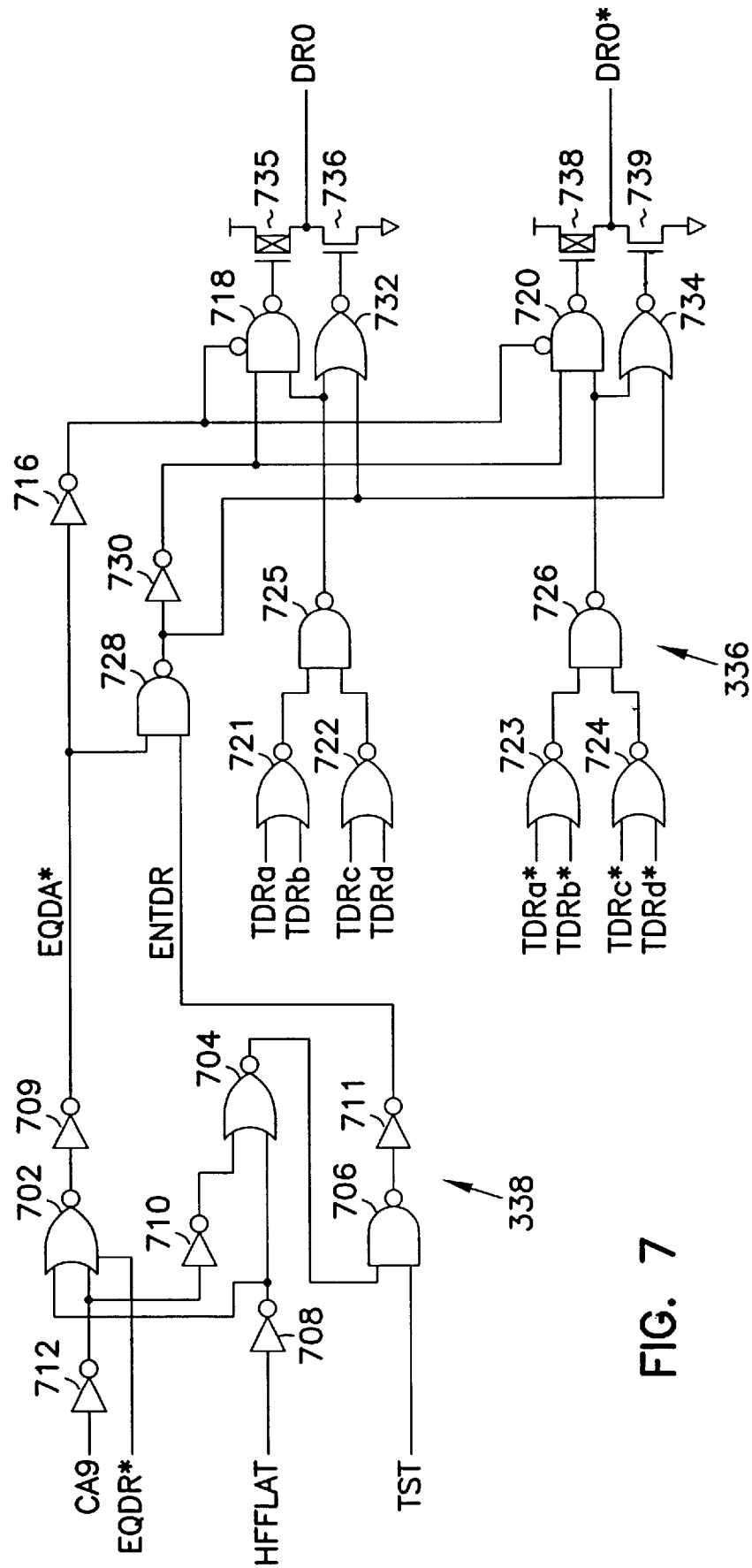
FIG. 7 is a schematic diagram of a test circuit and a test circuit control that are associated with the helper flip flop circuit of FIG. 4.

Referring now to FIG. 7, the test circuit control 338 and test circuit 336 are conventional circuits that have been modified to provide the automatic equilibration of non-selected data read lines in accordance with the invention. The test circuit control includes a NOR gate 702, a NOR gate 704, a NAND gate 706 and inverters 708–712. NOR gate 702 has a first input connected to the output of inverter 712 to receive the inverted state of a column address bit CA9 and a second input connected to the output of inverter 709 to receive the helper flip flop clock signal HFFLAT*. For test circuit control 338 (and the test circuit control associated with data read line pairs DR2, DR2* and DR5, DR5*), a logic low level for signal CA9 disables the test circuit control. The test circuit control (not shown) that is associated with data read line pair DR1, DR1* and DR6, DR6* and the test circuit control (not shown) associated with data read line pair DR3, DR3* and DR4, DR4* respond to the low state for the address bit CA9.

NOR gate 702 is enabled when a data read line equilibration enable signal EQDR* is being produced by the control logic 28 (FIG. 1). The output of NOR gate 702 is inverted by inverter 709 to produce a signal EQDA* for the test circuit 336. Signal EQDA* causes both lines of the data read line pair DR0, DR0*, to which the control circuit is connected, to be equilibrated to a logic high level simultaneously.

Inverter 710 has its input connected to receive address bit CA9 and its output connected to one input of NOR gate 704. A second input of NOR gate 704 is connected to the output of inverter 708 to receive signal HFFLAT*. The output of NOR gate 704 is connected to an input of NAND gate 706 which has a second input connected to receive the signal TST. The output of NAND gate 706 is inverted by inverter 711 for producing a test enable signal ENTDR for the test circuit 338.

The test circuit 336 includes inverter 716 and controllable NAND gates 718 and 720. The test circuit additionally includes NOR gates 721–724, NAND gates 725 and 726, a NAND gate 728 and an inverter 730. The NOR gates 721 and 722 receive signals TDRa-TDRd, which specify four data read lines. Similarly, the NOR gates 723 and 724 receive signals TDRa*-TDRd*, which specify the complementary data read lines. The outputs of NOR gates 721 and 722 are combined by NAND gate 725, the output of which is connected to one input of NAND gate 718 and one input of a NOR gate 732. Similarly, the outputs of NOR gates 723 and 724 are combined by NAND gate 726, the output of which is connected to one input of NAND gate 720 and one input of a NOR gate 734.

The NAND/NOR gate pair 718, 732 and NAND/NOR gate pair 720, 734, along with series-connected p-type transistor 735 and n-type transistor 736 and series-connected p-type transistor 738 and n-type transistor 739 form a tri-statable output driver stage for the test circuit for driving the data read lines DR0 and DR0*. The test circuit provides for compression testing of the memory in a manner known in the art and which does not form a part of the present invention. The NAND/NOR logic provides an output to the output driver stage for equilibrating the data read line pair DR0 and DR0* whenever this data read line pair is not selected during a read operation.

To this end, the signal EQDA* is inverted by inverter 716 and used to enable the NAND gates 718 and 720 of the output driver stage of the test circuit, causing the transistors 735 and 738 to conduct and apply a voltage, such as the supply voltage VCC, to the data read line pair DR0 and DR0*. When the signal EQDA* is in its active low level, the output driver stage presents a high impedance output to the data read line pair DR0 and DR0*.

It is pointed out that the test circuit 336 and associated test control 338 are conventional circuits which are used in compression testing of the SDRAM. These circuits are modified to add the NOR gate 702, the inverter 709, and the inverter 716 and to substitute controllable NAND gates 718 and 720 for the NAND gates of the conventional circuit. In known SDRAM devices, the test circuit is active only during the test mode. In accordance with the invention, a portion of the output driver stage of the test circuit is used in equilibrating the non-selected data read lines. Thus, there is no need for additional circuits on the die to provide the automatic equilibration function. The test circuits associated with the eight data read lines do not form part of the invention except that these circuit elements are added to the test circuits and portions of the existing test circuit are used for compression testing.

The following description of the operation of the SDRAM device 10 which provides latched data read lines, makes reference initially to FIGS. 1–3. For purposes of illustration of the operation, it is assumed that the bank address signal BA selects the top bank 22. Also, the column address bit CA9 is at a logic low level, or CA9* is in its active state, so that portions 240 and 242 are selected as the memory portions from which data is to be read and the data line pairs DR0, DR0*, and DR7, DR7*, and data line pairs DR2, DR2* and DR5, DR5* to which the data read out is to be applied. The column address bit CA9, being in a low state, disables the test circuit control 338 associated data read line pairs DR0, DR0* and DR7, DR7* and the test circuit control (not shown) associated with data read line pair DR2, DR2* and DR5, DR5*. Moreover, the column address bit CA9 enables the test circuit control associated with the non-selected data read line pairs DR1, DR1* and DR6, DR6*, and DR3, DR3* and DR4, DR4*.

Referring now to FIG. 5, the select signal SEC and the enable signal IO_EN, which are produced by the control logic 28 (FIG. 1), enable NAND gate 502 causing the output of gate 502 to become logic low level. This output is coupled through inverters 511 and 512 to NOR gate 506, priming NOR gate 506 to follow the helper flip flop signal HFFLAT*. Accordingly, when the signal HFFLAT is provided by the control logic 28, signal HFFLAT* becomes logic low, enabling helper flip flop control circuit 331 to produce the latch signal LOCLAT* for latching the data read from the memory bank into the helper flip flops. Also, because signal TST* is high, the output of NOR gate 506 enables NAND gate 504, producing the enable signal ENDR* and, via inverter 514, the signal ENDR for driving the data read line pairs in accordance with the data latched by the corresponding helper flip flops.

Figure 8:
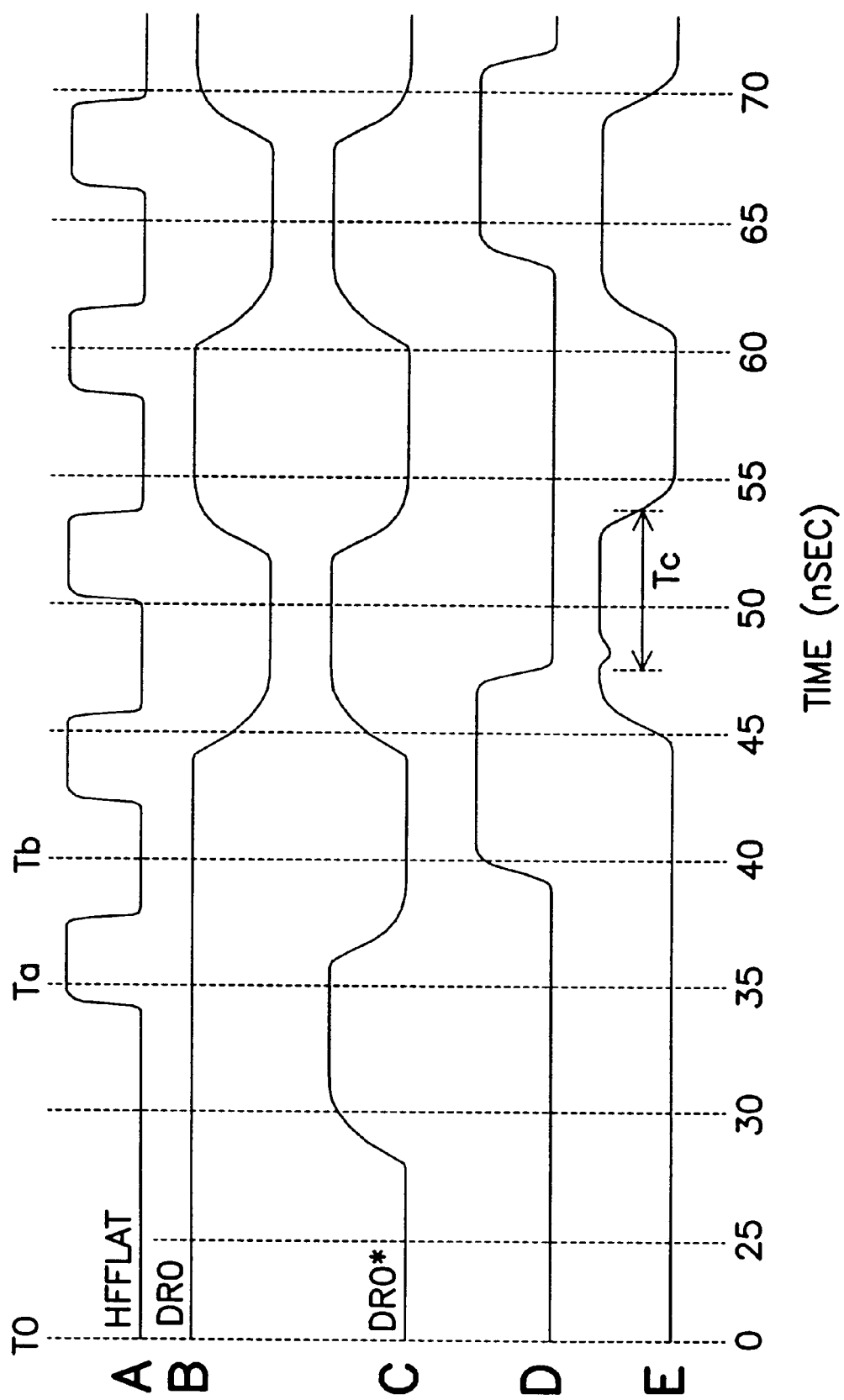
FIG. 8 is a timing diagram illustrating the relationship between signals produced by the data output circuits during transfer of data from the memory array to the data output register of the synchronous random access memory incorporating the invention.

Referring to FIG. 8, line A, illustrates the clock signal HFFLAT that latches the data into the helper flip flop 321, the first pulse being provided at a time Ta that occurs 35 nanoseconds after an arbitrary starting time T0. The waveforms for the data appearing on the data read line pair DR0 and DR0* is illustrated in lines B and C of FIG. 8. Initially, the data read lines DR0, DR0* are equilibrated to a voltage, such as the VCC supply, because this data read line pair was not selected in the previous read cycle.

Referring now to FIG. 6, because the top bank 22 (FIG. 2) has been selected by the bank address bit BA, the signal SECT* is in its true state. Accordingly, data appearing on input/output lines IO0 and IO0* is applied to the flip flop 406 through access transistors 611 and 612 and isolation transistors 616 and 618. The data is latched into the flip flop 406 in response to the signal LOCLAT*. The signal LOCLAT*, through inverter 618, also causes isolation transistors 616 and 617 to turn off, isolating the flip flop from the input/output lines. The signals ENDR and FNDR* enable the NAND/NOR logic to follow the data latched by the flip flop 406 and drive one of the data read lines of the data read line pair DR0 and DR0* high while driving the other data read line of the data read line pair low.

Referring to FIG. 3, the data that is provided at the output of the helper flip flop circuit 220, when applied to data read line pair DR0, DR0* is latched by the data read latch circuits 302 and 304, respectively, substantially as soon as the data becomes available at the output of the helper flip flop circuit 220. The data latched by the data read latch circuits 302 and 304 corresponds to the waveforms shown in lines B and C of FIG. 8, but delayed slightly by the switching time for the two stages 306, 308 of the inverter latch 302 associated with data read line DR0, and stages 310 and 312 of inverter 304 associated with data read line DR0*. The data switches with each clock or latch pulse HFFLAT as can be seen by comparing the waveforms appearing in lines A–C of FIG. 8. Accordingly, when the helper flip flop latch signal HFFLAT is terminated subsequently, the data remains latched in the data read line latch until new data is provided or the data read lines are equilibrated.

Referring additionally to FIG. 7, in the present example, the column address bit CA9 is high, disabling the test circuit control 338. Consequently, NAND gates 718 and 720 are disabled, providing a high impedance to the paired data read lines DR0, D0*. Likewise, the test circuit control 337 for the test circuit associated with data read lines DR7, DR7* is also disabled, as are the test circuit controls associated with data read line pairs DR2, DR2* and DR5, DR5*. However, the test circuit controls associated with the non-selected data read line pairs are enabled to equilibrate these data read line pairs.

It is pointed out that for the case where data read line pair DR0 and DR0* is not selected, the column address bit CA9 enables NOR gate 702 to be enabled when signal HFFLAT is produced, so that signal EQDA* is produced at the output of inverter 708. The signal EQDA*, through inverter 716 of the test circuit 336, turns on these gates. Consequently, the output driver transistors 735 and 738 are turned on and apply the supply voltage at VCC to the data read line pair DR0 and DR0* for equilibrating these data read lines. The equilibration is discontinued when signal HFFLAT terminates.

Referring to FIG. 8, the data applied to the data read line pair DR0, DR0* is valid for nearly the entire read cycle time. At a time Tb, which occurs 40 nanoseconds after time T0, a latch pulse IND, shown in line D of FIG. 8, is provided for latching the data appearing on the data read line pair DR0 and DR0* into data output latch circuit 211 of the data output register 32 in the conventional manner. In the exemplary embodiment, the data is latched at a time 47 nanoseconds following time T0. The waveform for the data latched in the data output latch 211 is illustrated in line E of FIG. 8. As can be seen by comparing the waveforms on lines D and E, because the data is latched by the data read latch circuits 230, there is additional time, as indicated at Tc, in the order of 6 nanoseconds, for latching the data into the data output latch circuit 211. This allows the duration of the read cycle to be shortened which, in turn, enables the memory system to be run at a faster cycle time. The system does not have to wait for the data to propogate down the data read lines DR0–DR7 and to be latched in the data output register 32 before terminating the clock signal HFFLAT for the helper flip flops 218 for initiating a further read operation.

Thus, it has been shown that the invention provides a method and circuit for self-latching data read lines in the data output path of a semiconductor memory device. In accordance with the invention, a data read line latch circuit is interposed between the helper flip flops and the data output register so that data read out of the memory array is latched substantially as soon as the data becomes available. This eliminates the propagation delays that are associated with the physical separation between the helper flip flops, which are located near the memory array and the data output register which is located adjacent to the data output pins of the memory device. Moreover, the latching of the data at the output of the helper flip flops obviates the need to equilibrate the data read lines between read cycles. Further in accordance with the invention, the non-selected data read lines are automatically equilibrated while the selected data read lines are being driven.

What is claimed is:

1. A method of reading data from a memory array, comprising:
   addressing a first memory cell of the memory array;
   latching data from the first memory cell in a data read latch circuit, thereby producing first latched data;
   latching the first latched data in a data output register, thereby producing second latched data;
   reading the second latched data; and
   addressing a second memory cell of the memory array prior to latching the first latched data in the data output register.

2. The method of claim 1, wherein latching data from the first memory cell in the data read latch circuit comprises self-latching data from the first memory cell in the data read latch circuit.

3. A method of reading data from a memory array, comprising:
   addressing a first memory cell of the memory array;
   self-latching data from the first memory cell in a data read latch circuit, thereby producing first latched data;

latching the first latched data in a data output register, thereby producing second latched data;

reading the second latched data; and addressing a second memory cell of the memory array prior to latching the first latched data in the data output register.

4. A method of reading data from a memory array, comprising:

addressing a first memory cell of the memory array;

latching data from the first memory cell in a data read latch circuit, thereby producing first latched data;

latching the first latched data in a data output register, thereby producing second latched data;

reading the second latched data; and addressing a second memory cell of the memory array prior to latching the first latched data in the data output register and subsequent to latching data from the first memory cell in the data read latch circuit.

5. A method of reading data from a memory array, comprising:

addressing a first memory cell of the memory array;

latching data from the first memory cell in a data read latch circuit, thereby producing first latched data;

latching the first latched data in a data output register, thereby producing second latched data;

reading the second latched data;

addressing a second memory cell of the memory array prior to latching the first latched data in the data output register;

latching data from the second memory cell in the data read latch circuit, thereby producing third latched data;

latching the third latched data in the data output register subsequent to reading the second latched data, thereby producing fourth latched data; and reading the fourth latched data.

6. The method of claim 5, wherein latching data from the first memory cell in the data read latch circuit comprises self-latching data from the first memory cell in the data read latch circuit, and wherein latching data from the second memory cell in the data read latch circuit comprises self-latching data from the second memory cell in the data read latch circuit.

7. A method of reading data from a memory array, comprising:

addressing a first memory cell of the memory array;

self-latching data from the first memory cell in a data read latch circuit, thereby producing first latched data;

latching the first latched data in a data output register, thereby producing second latched data;

reading the second latched data;

addressing a second memory cell of the memory array prior to latching the first latched data in the data output register;

self-latching data from the second memory cell in the data read latch circuit, thereby producing third latched data;

latching the third latched data in the data output register subsequent to reading the second latched data, thereby producing fourth latched data; and reading the fourth latched data.

8. A method of reading data from a memory array, comprising:

addressing a first memory cell of the memory array;

latching data from the first memory cell in a data read latch circuit, thereby producing first latched data;

latching the first latched data in a data output register, thereby producing second latched data;

reading the second latched data;

addressing a second memory cell of the memory array subsequent to latching data from the first memory cell in the data read latch circuit and prior to latching the first latched data in the data output register;

latching data from the second memory cell in the data read latch circuit, thereby producing third latched data;

latching the third latched data in the data output register subsequent to reading the second latched data, thereby producing fourth latched data; and reading the fourth latched data.

9. A method of reading data from a memory array, comprising:

addressing a memory cell of the memory array, thereby producing a first addressed memory cell;

transferring data from the first addressed memory cell to a data read latch circuit, thereby producing first read data;

latching the first read data in the data read latch circuit, thereby producing first latched data;

transferring the first latched data to a data output register;

latching the first latched data in the data output register, thereby producing second latched data;

reading the second latched data;

addressing a memory cell of the memory array subsequent to latching the first read data in the data read latch circuit and prior to reading the second latched data, thereby producing a second addressed memory cell;

transferring data from the second addressed memory cell to the data read latch circuit, thereby producing second read data;

latching the second read data in the data read latch circuit, thereby producing third latched data;

transferring the third latched data to the data output register;

latching the third latched data in the data output register, thereby producing fourth latched data; and reading the second latched data.

10. A method of reading data from a memory array, comprising:

addressing a memory cell of the memory array during a first read cycle, thereby producing a first addressed memory cell;

transferring data from the first addressed memory cell to a first data read latch circuit via a first data read line, thereby producing first read data;

latching the first read data in the first data read latch circuit, thereby producing first latched data;

transferring the first latched data to a data output register;

latching the first latched data in the data output register during the first read cycle, thereby producing second latched data;

addressing a memory cell of the memory array during a second read cycle, thereby producing a second addressed memory cell, wherein the second read cycle is initiated prior to latching the first latched data in the data output register;

transferring data from the second addressed memory cell to a second data read latch circuit via a second data read line, thereby producing second read data;

latching the second read data in the second data read latch circuit, thereby producing third latched data;

transferring the third latched data to the data output register;

latching the third latched data in the data output register during the second read cycle, thereby producing fourth latched data;

reading the second latched data during the first read cycle; and reading the fourth latched data during the second read cycle.

11. The method of claim 10, wherein latching the first read data in the first data read latch circuit comprises self-latching the first read data in the first data read latch circuit, further wherein latching the second read data in the second data read latch circuit comprises self-latching the second read data in the second data read latch circuit.

12. A method of reading data from a memory array, comprising:

addressing a memory cell of the memory array during a first read cycle, thereby producing a first addressed memory cell;

transferring data from the first addressed memory cell to a first data read latch circuit via a first paired data read lines, thereby producing first read data;

latching the first read data in the first data read latch circuit, thereby producing first latched data;

transferring the first latched data to a data output register;

latching the first latched data in the data output register during the first read cycle, thereby producing second latched data;

addressing a memory cell of the memory array during a second read cycle, thereby producing a second addressed memory cell, wherein the second read cycle is initiated prior to latching the first latched data in the data output register;

transferring data from the second addressed memory cell to a second data read latch circuit via a second paired data read lines, thereby producing second read data;

latching the second read data in the second data read latch circuit, thereby producing third latched data;

transferring the third latched data to the data output register;

latching the third latched data in the data output register during the second read cycle, thereby producing fourth latched data;

equilibrating the first paired data read lines during the second read cycle;

equilibrating the second paired data read lines during the first read cycle;

reading the second latched data during the first read cycle; and reading the fourth latched data during the second read cycle.

13. The method of claim 12, wherein equilibrating comprises equilibrating with a portion of an output driver stage of a test circuit.

14. The method of claim 12, wherein latching the first read data in the first data read latch circuit comprises self-latching the first read data in the first data read latch circuit, further wherein latching the second read data in the second data read latch circuit comprises self-latching the second read data in the second data read latch circuit.

* * * * *